United States Patent
Park et al.

(10) Patent No.: US 8,508,292 B2
(45) Date of Patent: Aug. 13, 2013

(54) PHASE MATCHING BAND-PASS FILTER USING EXPONENTIAL FUNCTION APPROXIMATION

(75) Inventors: Han Gue Park, Seoul (KR); Byung Tae Yoon, Suwon-si (KR); Jae Sub Lee, Yongin-si (KR); Mi Hyun Son, Seoul (KR); Jong Wook Zeong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 21 days.

(21) Appl. No.: 13/145,914

(22) PCT Filed: Jan. 22, 2010

(86) PCT No.: PCT/KR2010/000421
§ 371 (c)(1),
(2), (4) Date: Aug. 18, 2011

(87) PCT Pub. No.: WO2010/085112
PCT Pub. Date: Jul. 29, 2010

(65) Prior Publication Data
US 2011/0291751 A1    Dec. 1, 2011

(30) Foreign Application Priority Data
Jan. 22, 2009  (KR) .................. 10-2009-0005299

(51) Int. Cl.
*H03K 5/00*    (2006.01)
(52) U.S. Cl.
USPC .......................................... 327/557; 327/552
(58) Field of Classification Search
USPC .................................................. 327/551–559
See application file for complete search history.

(56) References Cited

U.S. PATENT DOCUMENTS

| 4,660,000 A | 4/1987 | Kleinberg | |
| 5,763,873 A * | 6/1998 | Beck et al. | 250/214 B |
| 7,042,317 B2 * | 5/2006 | Xiao et al. | 333/214 |

FOREIGN PATENT DOCUMENTS

JP    08-130440 A    5/1996

* cited by examiner

*Primary Examiner* — Dinh T. Le
(74) *Attorney, Agent, or Firm* — Jefferson IP Law, LLP

(57) ABSTRACT

A The present invention relates to a phase matching band-pass filter using exponential function approximation, comprising an inductor including a parasitic resistor, a first device wherein a first amplifier is connected in a feedback mode, a capacitor including a parasitic resistor, a plurality of filter devices including a second device that is connected with a second amplifier in a feedback mode, and a coupling capacitor that connects the plurality of filter devices; the impedance of the first device has an increasing exponential function relation with a frequency, impedance of the second device has a decreasing exponential function relation with the frequency, and the first device is connected with the second device in parallel. According to the phase matching band-pass filter using exponential function approximation of this invention, conventional inductors and capacitors can be used 0 without modification or use of negative resistance, resulting in a high-performance phase matching band-pass filter. In addition, when a device with impedance characteristics that approximate an exponential function is used, the degree of frequency selection 0 becomes higher than that of conventional filters resulting in filters having high Q values and stability, such as channel selection filters.

14 Claims, 7 Drawing Sheets

$$A_2 = \frac{1}{j\omega CR} \Rightarrow Z_2 = \frac{R + \frac{1}{j\omega C}}{1 - \frac{1}{j\omega CR}} \cong R \cdot e^{\frac{2}{j\omega CR}}$$

$$A_1 = j\omega \frac{L}{R} \Rightarrow Z_1 = \frac{R + j\omega L}{1 - j\omega \frac{L}{R}} \cong R \cdot e^{j2\omega \frac{L}{R}}$$

$$A_2 = \frac{1}{j\omega CR} \Rightarrow Z_2 = \frac{R + \frac{1}{j\omega C}}{1 - \frac{1}{j\omega CR}} \cong R \cdot e^{\frac{2}{j\omega CR}}$$

PHASE MATCHING BAND-PASS FILTER USING EXPONENTIAL FUNCTION APPROXIMATION

BACKGROUND OF THE INVENTION

1. Field of the Invention

The present invention relates to a phase matching band-pass filter and, in particular, to a phase matching band-pass filter composed of devices having impedance changes following an exponential function in relation to frequency.

2. Description of the Related Art

The transceiver for use in baseband communication is provided with a low-pass filter to filter out the interferer while passing the original signal. Most communications are done over radio frequency carriers to avoid interference from each other, and the Radio Frequency (RF) transceiver of an RF system should use an RF band-pass filter that pass signals from a specific frequency band on which it operates.

In the current frequency allocation system in which the entire range of frequency spectrum is densely allocated for different usages, the load of the digital front end or converter (ADC) of the transceiver increases due to the other frequency band signals if the RF band-pass filter having High-Q value is not used. This means the load increase of the digital front end or ADC following the band-pass filter of the receiver. Also, most of conventional RF transceivers include the filters implemented Complementary Metal-Oxide Semiconductor (CMOS) process. In most cases, the RF band-pass filter having High-Q value is implemented with a Surface Acoustic Wave Filter (SAW Filter). However, the SAW filter which uses mechanical resonance is large in volume and impossible to integrate in the form of IC, resulting in increase of whole manufacturing cost of the RF transceiver.

SUMMARY OF THE INVENTION

Problem to be Solved

In order to solve the above problem, the present invention proposes a phase matching band-pass filter using the exponential function approximation that is capable of improving the Q value of the filter.

Also, the present invention proposes a phase matching band-pass filter that is capable of having the Q value greater than the conventional filters by implementing a new device of which impedance feature is of an exponential function in relation to frequency while using the non-ideal inductor and capacitor having parasitic resistances.

Furthermore, the present invention proposes a phase matching band-pass filter that is capable of being controlled accurately by removing the interference to the signal input to the receiver.

Means for Solving the Problem

In order to solve the above problem, the filter device according to an embodiment of the present invention includes a first device to which an inductor L having parasitic resistance $R_1$ and a first amplifier are feedback-connected and a second device to which a capacitor C having parasitic resistance $R_2$ and a second amplifier are feedback-connected, wherein the impedance of the first device has a relation of an increase exponential function to frequency $w$, the impedance of the second device has a relation of a decrease exponential function to frequency, and the first and second devices are connected in parallel.

In order to solve the above problem, the filter device according to another embodiment of the present invention includes a first device to which an inductor L having parasitic resistance $R_1$ and a first amplifier are feedback-connected and a second device, wherein the impedance of the first device has a relation of an increase exponential function to frequency $w$, the first and second device are connected in parallel, and combined impedance of the first and second devices becomes infinite at a predetermined frequency.

In order to solve the above problem, the filter device according to another embodiment of the present invention includes a first device to which an inductor L having parasitic resistance $R_1$ and a first amplifier are feedback-connected and a second device, wherein the impedance of the first device has a relation of a decrease exponential function to frequency $w$, the first and second devices are connected in parallel, and combined impedance of the first and second devices becomes infinite at a predetermined frequency.

In order to solve the above problem, the band-pass filter according to another embodiment of the present invention includes a plurality of filter devices including a first device to which an inductor L having parasitic resistance $R_1$ and a first amplifier are feedback-connected and a second device to which a capacitor C having parasitic resistance $R_2$ and a second amplifier are feedback-connected and a coupling capacity connecting the filter devices to each other, wherein the impedance of the first device has a relation of an increase exponential function to frequency $w$, the impedance of the second device has a relation of a decrease exponential function to frequency, and the first and second devices are connected in parallel. Preferably, the first device has impedance of $$\frac{R_1 + jwL}{1 - \frac{jwL}{R_1}} \text{ and } \frac{wL}{R_1} \ll 1,$$

and the second device has impedance of $$\frac{R_2 + \frac{1}{jwC}}{1 - \frac{1}{jwCR_2}} \text{ and } \frac{1}{wCR_2} \ll 1.$$

In order to solve the above problem, the bandwidth pass filter according to another embodiment of the present invention includes a plurality of filter devices including a first device to which an inductor L having parasitic resistance $R_1$ and a first amplifier are feedback-connected and a second device and a coupling capacitor Connecting the filter devices to each other, wherein the impedance of the first device has a relation of an increase exponential function to frequency $w$, the first and second devices are connected in parallel, and combined impedance of the first and second devices becomes infinite at a predetermined frequency.

In order to solve the above problem, the bandwidth pass filter according to still another embodiment of the present invention includes a plurality of filter devices including a first device to which an inductor L having parasitic resistance $R_1$ and a first amplifier are feedback-connected and a second device and a coupling capacitor Connecting the filter devices to each other, wherein the impedance of the first device has a relation of a decrease exponential function to frequency $w$, the first and second devices are connected in parallel, and combined impedance of the first and second devices becomes infinite at a predetermined frequency.

Advantageous Effects

With the phase matching band-pass filter using the exponential function approximation according to the present invention, it is possible to implement a high performance phase matching band-pass filter with the conventional inductor and capacitor without using negative-R. By using the device of which impedance characteristic approximates to an exponential function in relation to frequency, it is possible to implement the filter having the high frequency selectivity as compared to the conventional filter and obtaining high Q value and stability as a channel selection filter.

With the phase matching band-pass filter using the exponential function approximation according to the present invention, it is possible to reduce the volume and manufacturing cost of the receiver significantly, by substituting the SAW filter, and reinforce the channel selection function, thereby mitigating the load of the digital front-end and analog-digital converter (ADC) of the digital circuit of the transceiver.

DETAILED DESCRIPTION OF EXEMPLARY EMBODIMENTS

Exemplary embodiments of the present invention are described hereinafter with reference to the accompanying drawings in detail. The same reference numbers are used throughout the drawings to refer to the same or like parts. Detailed description of well-known functions and structures incorporated herein may be omitted to avoid obscuring the subject matter of the present invention.

The terms and words used in this description and the appended claims are not to be interpreted in common or lexical meaning but, based on the principle that an inventor can adequately define the meanings of terms to best describe his/her own invention, to be interpreted in the meaning and concept conforming to the technical concept of the present invention.

Figure 1:
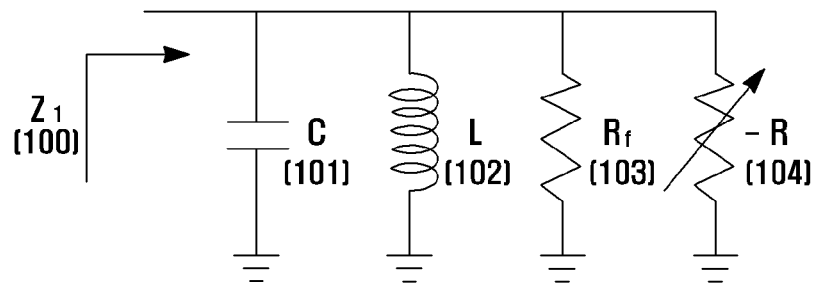
FIG. 1 is a circuit diagram illustrating a configuration of an inductor-capacitor filter device used in a general band-path filter.

FIG. 1 is a circuit diagram illustrating a configuration of an inductor-capacitor filter device used in a general band-path filter.

Referring to FIG. 1, the typical band-pass filter uses the resonance characteristics of the capacitor 101 and the inductor 102. Particularly, the capacitor 101 and the inductor 102 are connected in parallel to form an L-C tank, and the input impedance $Z_{IN}$ has the infinite value in the resonance frequency. By connecting the L-C tank with coupling capacitor in stepwise manner, it is possible to implement a band-pass filter characteristic.

Meanwhile, the capacity 101 and the inductor 102 have the respective parasitic resistances to degrade the filter characteristic. In FIG. 1, $R_F$ 103 denotes the equivalent resister of the parasitic resistance and has the impedance value with the frequency as a factor. In order to solve the problem, an active circuit is used to implement negative resistance $-R$ 104 for canceling.

The conventional band path filter requires an inductor having a high Q value to secure the high selectivity. However, the inductor has a limit of Q value due to the processing reason and requires the use of an active circuit implementing negative resistance, the active circuit casing a problem degrading the stability of the filter itself. Also, since the inductor and the capacitor of the conventional band-pass filter have the linear function relationship in relation to frequency, there is the limit in the frequency selectivity. Accordingly, the conventional band-pass filter is not appropriate as the filter requiring very high Q value such as a channel selection filter. The CMOS RF band-pass filters proposed to solve this problem are still remaining as an ideal proposal. The reason is because, although the band-pass filter used as the channel selection filter requiring very high Q value is implemented, the stability of the filter is not guaranteed with the necessary Q value.

Figure 2:
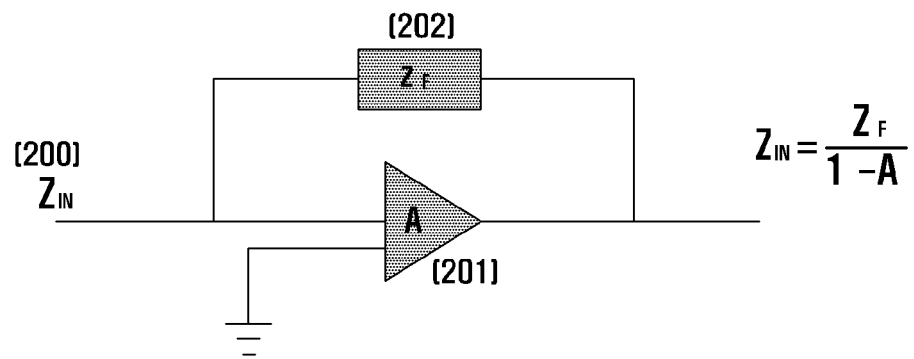
FIG. 2 is a circuit diagram illustrating a device of which impedance characteristic has an exponential function characteristic in relation to frequency.

FIG. 2 is a circuit diagram illustrating a device of which impedance characteristic has an exponential function characteristic in relation to frequency.

Referring to FIG. 2, the device of which impedance characteristic has the exponential function characteristic in relation to frequency includes an amplifier 201 having the gain A and a resister 202 having the impedance $Z_F$ such that the input resister $Z_{IN}$ 200 has the impedance value expressed by equation (1):

$$Z_{IN} = \frac{Z_F}{1-A}. \tag{1}$$

According to the Taylor series expansion, equation (2) can be derived:

$$e^{j2x} \cong \frac{1+jx}{1-jx} \text{(where, } x \ll 1\text{)}. \tag{2}$$

Accordingly, if the resistance $Z^F$ 202 and the gain A are determined by substituting equation (2) into the device having the input impedance of $$\frac{Z_F}{1-A}$$

equation (1), it is possible to implement the device of which impedance characteristic follow an exponential function in relation to frequency using the conventional non-ideal inductor and capacitor. How to implement the device is described hereinafter in more detail.

Figure 3:
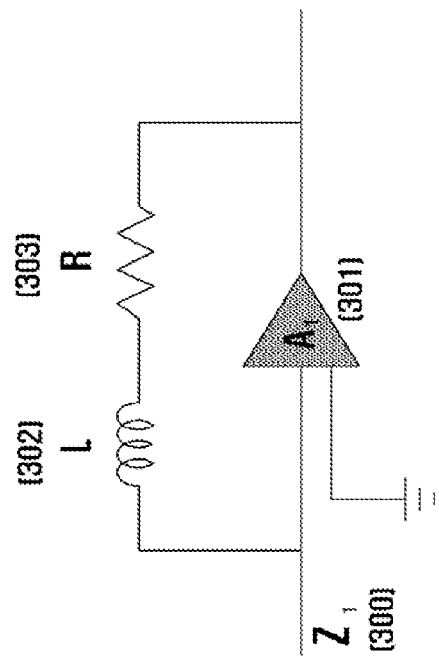
FIGS. 3 and 4 are circuit diagrams illustrating configurations of the device of which impedance characteristic has the exponential function characteristic in relation to frequency according to an embodiment of the present invention.
Figure 4:
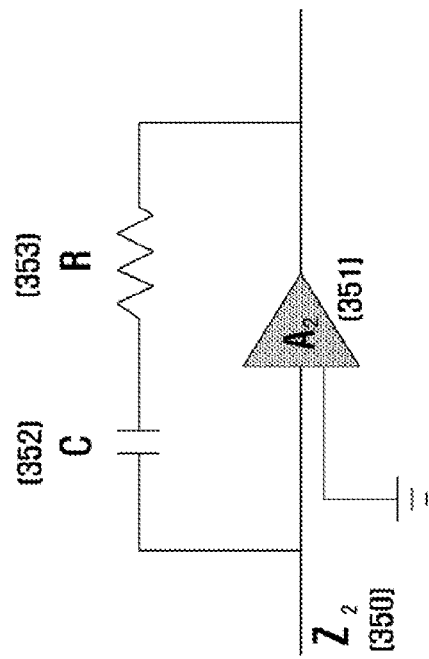

FIGS. 3 and 4 are circuit diagrams illustrating configurations of the device of which impedance characteristic has the exponential function characteristic in relation to frequency according to an embodiment of the present invention. Equations (3) and (4) show the results approximated the impedance having the exponential function relationship in relation to frequency using equation (2).

$$e^{j2w\frac{L}{R}} \cong \frac{1+jw\frac{L}{R}}{1-jw\frac{L}{R}} \left(\text{where, } \frac{wL}{R} \ll 1\right) \quad (3)$$

$$e^{\frac{2}{jwCR}} \cong \frac{1+\frac{1}{jwCR}}{1-\frac{1}{jwCR}} \left(\text{where, } \frac{1}{wCR} \ll 1\right) \quad (4)$$

Referring to equations (1) and (3), the input resister $Z_1$ satisfies $$\frac{Z_F}{1-A_1} = \frac{R+jwL}{1-jw\frac{L}{R}}.$$

Accordingly, $Z_F$ corresponds to the inductor L 302 such that the gain $A_1$ of the amplifier 301 becomes $$w\frac{L}{R}$$

and the phase is 90°. Accordingly, if configured as shown in FIG. 3, it is possible to implement the device of which impedance characteristic approximates to the increase exponential function $$R \cdot e^{j2w\frac{L}{R}}$$

in relation to frequency.

Referring to equations (1) and (4), the input resister $Z^1$ satisfies $$\frac{Z_F}{1-A_2} = \frac{R+\frac{1}{jwC}}{1-\frac{1}{jwCR}}.$$

Likewise, $Z_F$ corresponds to the capacitor C 352 such that the gain $A_2$ of the amplifier 351 becomes $$\frac{1}{wCR}$$

and the phase is −90°. Accordingly, if configured as shown in FIG. 4, it is possible to implement the device of which impedance characteristic approximates to the decrease exponential function $$R \cdot e^{\frac{2}{jwCR}}$$

in relation to frequency.

In summary, the device of which impedance characteristic follows an exponential function in relation to frequency can be implemented using the existing non-ideal inductor, capacitor, and amplifier.

Figure 5:
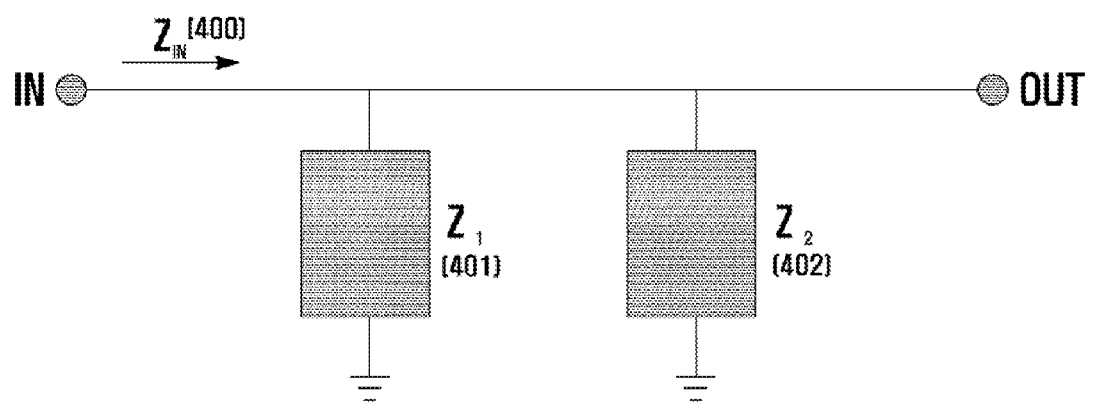
FIG. 5 is a circuit diagram illustrating a configuration of a filter device used in a phase matching band path filter according to an embodiment of the present invention.

FIG. 5 is a circuit diagram illustrating a configuration of a filter device used in a phase matching band path filter according to an embodiment of the present invention.

Referring to FIG. 5, the filter device used in the phase matching band-pass filter is configured in such a way that the above described two devices 401 and 402 of which impedance characteristics follow the exponential function in relation to frequency are connected in parallel. Particularly, the impedance characteristic of $Z_1$ 401 has the value approximating to $$R \cdot e^{j2w\frac{L}{R}},$$

and $Z_2$ has the value approximating to $$R \cdot e^{\frac{2}{jwCR}}.$$

Accordingly, the input impedance $Z_{IN}$ can be calculated according to equation (5):

$$Z_{IN} = Z_1 // Z_2 = R \cdot e^{j2w\frac{L}{R}} // R \cdot e^{\frac{2}{jwCR}} = R \cdot \frac{e^{j2w(\frac{L}{R}-\frac{1}{CR})}}{e^{j2w\frac{L}{R}} + e^{\frac{2}{jwCR}}}. \quad (5)$$

Meanwhile, in order to implement the band-pass filtering device, the input impedance of the devices connected in series should become 0 in a specific frequency band or the input impedance of the device connected in parallel should become infinite in a specific frequency. The filter device used in the phase matching band-pass filter of the present invention has the impedance characteristics of $Z_1$ 401 and $Z_2$ 402 approximating to $$R \cdot e^{j2w\frac{L}{R}} \text{ and } R \cdot e^{\frac{2}{jwCR}}$$

respectively such that $Z_{IN}$ to which $Z_1$ 401 and $Z_2$ 402 are connected in parallel has the characteristic becoming infinite at w satisfying equation (6):

$$\left|2w\frac{L}{R} + \frac{2}{wCR}\right| = (2n-1)\pi \text{ (where, } n \text{ is natural value)} \quad (6)$$

By connecting such filter devices with coupling capacitors in stepwise manner, it is possible to implement a band-pass filter.

Meanwhile, it is not mandatory for $Z_1$ 401 and $Z_2$ 402 to have the forms of $$R \cdot e^{j2w\frac{L}{R}} \text{ and } R \cdot e^{\frac{2}{jwCR}},$$

but the forms of $$R \cdot e^{j2w\frac{L}{R}}$$

and R or R and $$R \cdot e^{\frac{2}{jwCR}},$$

i.e. one of the tow is an exponential approximation function, and such that any form which makes the combined impedance becomes infinite at a specific frequency when the two impedances are connected in parallel obtains the similar effect.

Figure 6:
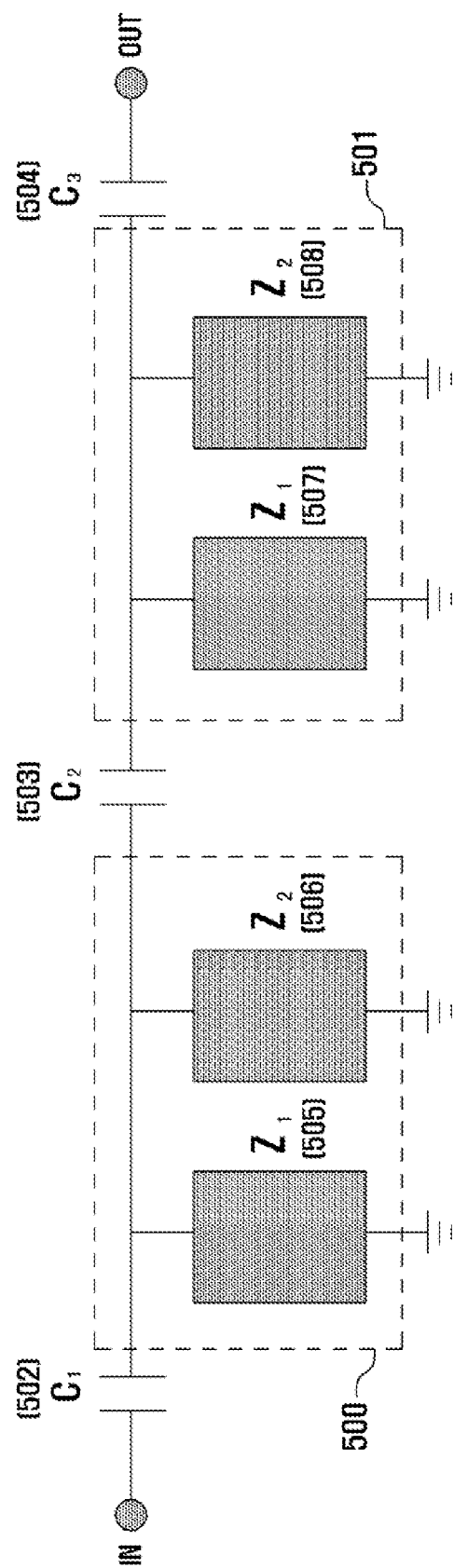
FIG. 6 is a circuit diagram illustrating a configuration of a phase matching band-pass filter according to an embodiment of the present invention.

FIG. 6 is a circuit diagram illustrating a configuration of a phase matching band-pass filter according to an embodiment of the present invention.

Referring to FIG. 6, the phase matching band-pass filter according to an embodiment of the present invention includes a first filter device 500, a first capacitor $C_1$ 502, a second capacitor $C_2$ 503, and a third capacitor $C_3$ 504. The first filter device 500 and the second filter device 501 include the first devices $Z_1$ 505 and 507 respectively. Also, the first filter device 500 and the second filter device 501 include the second devices $Z_2$ 506 and 508 respectively.

As shown in the drawing, the first capacitor 502, the second capacitor 503, and the third capacitor 504 are connected in series, and the second capacitor 503 is a coupling capacitor. Also, the second capacitor 503 and the first filter device 500 are connected to the first capacitor 502 in parallel, and the second filter device 501 and the third capacitor 504 are connected in parallel. Also, the first filter device 500 and the second filter device 501 are grounded.

In order to improve the filter characteristic, it is preferred that the characteristics of the first filter device 500 and the second filter device 501 has the characteristic opened in association to the first to third capacitors connected in series.

Figure 7:
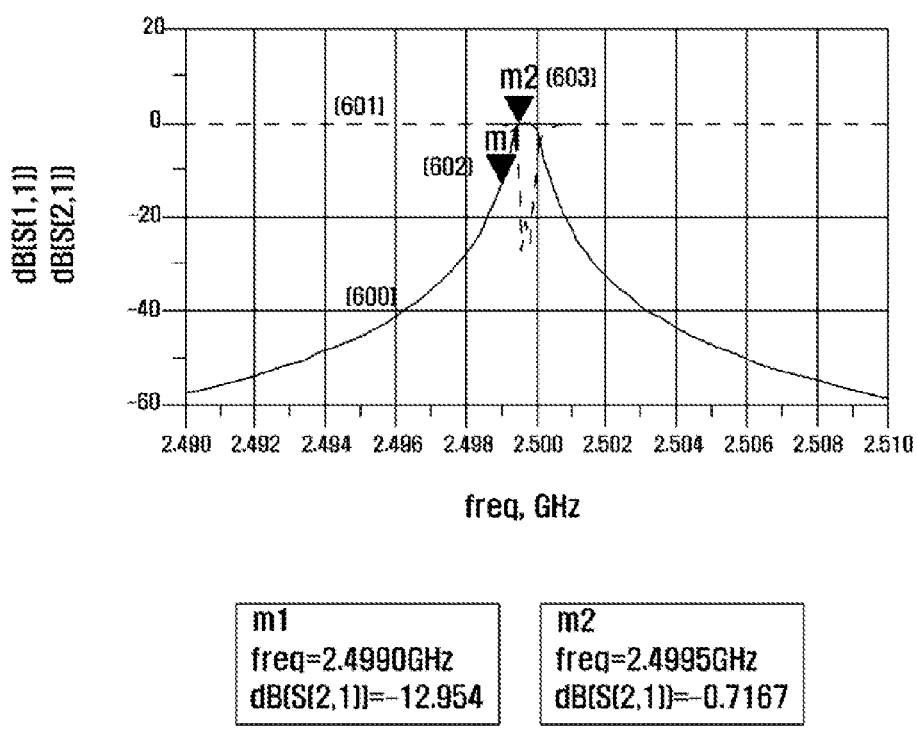
FIG. 7 is a graph illustrating the frequency characteristic of the phase matching band-pass filter according to an embodiment of the present invention.
Figure 8:
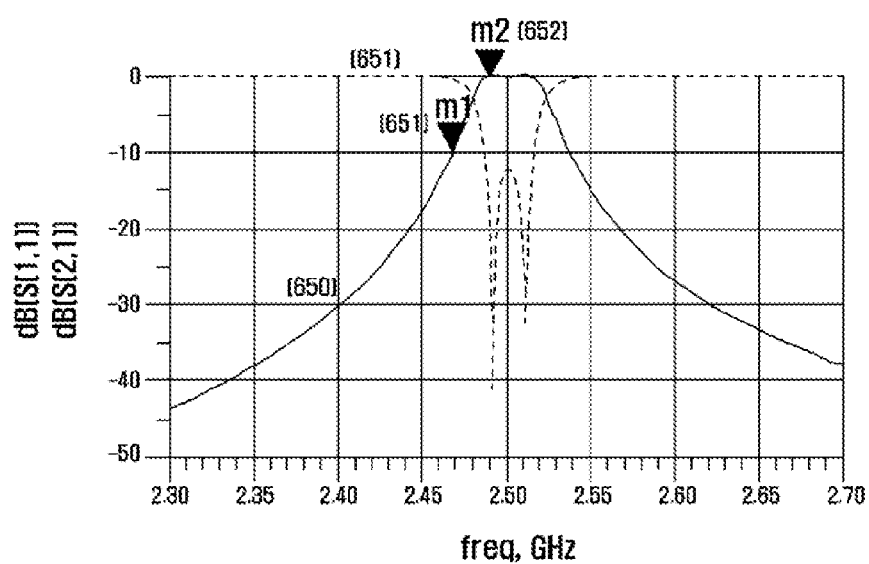
FIG. 8 is a graph illustrating the frequency characteristic of the conventional phase matching band-pass filter.

FIG. 7 is a graph illustrating the frequency characteristic of the phase matching band-pass filter according to an embodiment of the present invention, and FIG. 8 is a graph illustrating the frequency characteristic of the conventional phase matching band-pass filter. Particularly, the frequency characteristic is measured in the state where both the phase matching band-pass filter of the present invention and the conventional phase matching band-pass filter are configured to have the center frequency of 2.5 GHz.

In FIGS. 7 and 8, the solid lines denotes the forward power coupling coefficient $S_{2.1}$ of the phase matching band-pass filter, i.e.

$$20\log\frac{P_{OUT}}{P_{IN}}$$

in frequency band, and the dotted lines denotes the input power flection coefficient $S_{1.1}$, i.e.

$$20\log\frac{P_{REF}}{P_{IN}}$$

in frequency band.

Referring to FIG. 7, the phase matching band-pass filter of the present invention has a very high Q value as indicted by the forward power coupling coefficient $S_{2.1}$ 600 and the input power reflection coefficient $S_{1.1}$ 601. That is, it shows the filter characteristic having the very high selectivity to the extent showing the diminution over 12 dB at the 2.499 GHz band as the 1 MHz offset measurement position 602. Accordingly, the filter proposed in the present invention can be implemented to have the aforementioned superior impedance characteristic using the device of which impedance characteristic has the exponential function relationship in relation to frequency.

FIG. 8 shows the measurement result of the frequency characteristic in case where $Z_1$ and $Z_2$ are replaced by the ideal inductor and capacitor having infinite Q value. Referring to FIG. 8, it is shown that the diminution effect as much as less than 9 dB appears at 2.47 GHz band as the 30 MHz offset measurement position 651. The conventional band-pass filter using the resonance characteristics of ideal inductor and capacitor having the linear function relationship to frequency shows the significant inferiority as compared to the frequency characteristic of the phase matching band-pass filter, in spite of the use of ideal inductor and capacitor.

Figure 9:
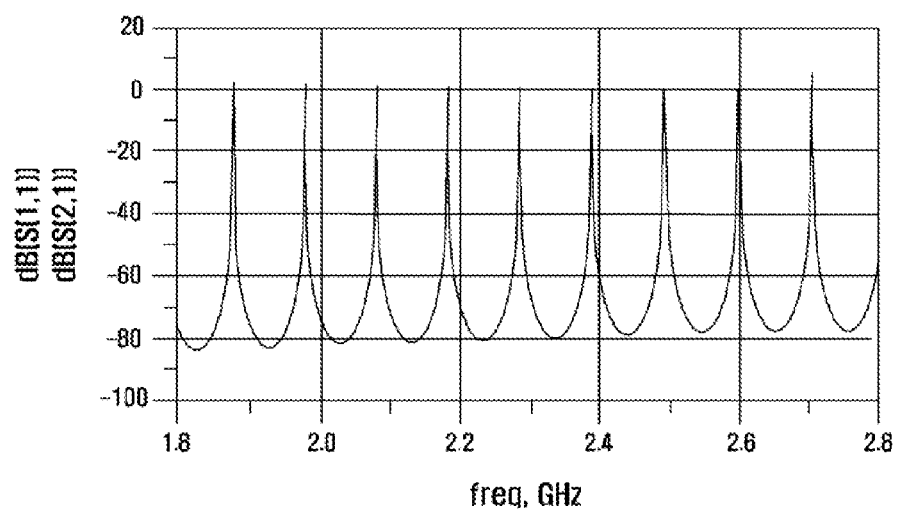
FIG. 9 is a graph illustrating the characteristic of a tank used in the phase matching band-pass filter according to an embodiment of the present invention.

FIG. 9 is a graph illustrating the characteristic of a tank used in the phase matching band-pass filter according to an embodiment of the present invention.

The phase matching band-pass filter proposed in the present invention has multiple pass-bands due to the 360° periodic characteristic of phase as shown in FIG. 9 and thus it is preferred to use along with the conventional band-pass filter.

Since the phase matching band-pass filter of the present invention is mainly applied to the field of the channel selection filter for selecting the channel from the signal that is already filtered by a band selection filter tuned to a specific frequency band, the periodic characteristic in view of the phase does not influence the to the problem to be solved by the present invention.

The exemplary embodiments disclosed, in the specification and drawings have been provided to help understand the present invention, but not limit the scope of the present invention. It is obvious to those skilled in the art that various changes in form and details may be made therein without departing from the spirit and scope of the invention as defined in the appended claims and their equivalents.

What is claimed is:
1. A filter device comprising:
a first circuit element comprising a first amplifier and an inductor L having parasitic resistance $R_1$, the inductor being feedback-connected to the first amplifier; and
a second circuit element comprising a second amplifier and a capacitor C having parasitic resistance $R_2$, the capacitor being feedback-connected to the second amplifier, wherein an equivalent impedance of the first circuit element is configured to increase exponentially according to increase of frequency W of an input signal to the first circuit element, an equivalent impedance of the second circuit element is configured to decrease exponentially according to increase of frequency of an input signal to the second circuit element, and the first and second circuit elements are connected in parallel.

2. The filter device of claim 1, wherein the first amplifier is configured to have a gain of $$\frac{wL}{R_1}$$

and to generate 90° phase shift.

3. The filter device of claim 2, wherein the first circuit element is configured to have the equivalent impedance of $$\frac{R_1 + jwL}{1 - \frac{jwL}{R_1}} \text{ and } \frac{wL}{R_1} \ll 1.$$

4. The filter device of claim 1, wherein the second amplifier is configured to have a gain of $$\frac{1}{wCR_2}$$

and to generate −90° phase shift.

5. The filter device of claim 4, wherein the second circuit element is configured to have the equivalent impedance of $$\frac{R_2 + \frac{1}{jwC}}{1 - \frac{1}{jwCR_2}} \text{ and } \frac{1}{wCR_2} \ll 1.$$

6. A filter device comprising:
a first circuit element comprising a first amplifier and an inductor L having parasitic resistance $R_1$ that is feedback-connected to the first amplifier; and
a second device,
wherein an equivalent impedance of the first circuit element is configured to increase exponentially according to increase of frequency W of an input signal to the first circuit element, the first and second circuit elements are connected in parallel, and an equivalent impedance of the combined first and second circuit elements becomes infinite at a predetermined frequency.

7. A filter device comprising:
a first circuit element comprising a first amplifier and an inductor L having parasitic resistance $R_1$, the inductor being feedback-connected to the first amplifier; and
a second device,
wherein an equivalent impedance of the first circuit element is configured to decrease exponentially according to increase of frequency W of an input signal to the first circuit element, the first and second circuit elements are connected in parallel, and an equivalent impedance of the combined first and second circuit elements becomes infinite at a predetermined frequency.

8. A band-pass filter comprising:
a plurality of filter devices including a first circuit element comprising a first amplifier and an inductor L having parasitic resistance $R_1$, the inductor being feedback-connected to the first amplifier and a second circuit element comprising a second amplifier and a capacitor C having parasitic resistance $R_2$, the capacitor being feedback-connected to the second amplifier; and
a coupling capacity connecting the filter devices to each other,
wherein an equivalent impedance of the first circuit element is configured to increase exponentially according to increase of frequency W of an input signal to the first circuit element, an equivalent impedance of the second circuit element is configured to decrease exponentially according to frequency of an input signal to the second circuit element, and the first and second devices are connected in parallel.

9. The band-pass filter of claim 8, wherein the first amplifier is configured to have a gain of $$\frac{wL}{R_1}$$

and to generate 90° phase shift.

10. The band-pass filter of claim 9, wherein the first circuit element is configured to have the equivalent impedance of $$\frac{R_1 + jwL}{1 - \frac{jwL}{R_1}} \text{ and } \frac{wL}{R_1} \ll 1.$$

11. The band-pass filter of claim 8, wherein the second amplifier is configured to have a gain of $$\frac{1}{wCR_2}$$

and to generate −90° phase shift.

12. The band-pass filter of claim 11, wherein the second circuit element is configured to have the equivalent impedance of $$\frac{R_2 + \frac{1}{jwC}}{1 - \frac{1}{jwCR_2}} \text{ and } \frac{1}{wCR_2} \ll 1.$$

13. A band-pass filter comprising:
a plurality of filter devices including a first circuit element comprising a first amplifier and an inductor L having parasitic resistance $R_1$, the inductor being feedback-connected to the first amplifier and a second circuit element; and
a coupling capacitor connecting the filter devices to each other,
wherein an equivalent impedance of the first circuit element is configured to increase exponentially according to increase of frequency W of an input signal to the first circuit element, the first and second circuit elements are connected in parallel, and an equivalent impedance of the combined first and second circuit elements becomes infinite at a predetermined frequency.

14. A band-pass filter comprising:

a plurality of filter devices including a first circuit element comprising a first amplifier and an inductor L having parasitic resistance $R_1$, the inductor being feedback-connected to the first amplifier and a second device; and a coupling capacitor connecting the filter devices to each other, wherein an equivalent impedance of the first circuit element is configured to decrease exponentially according to increase of frequency W of an input signal to the first circuit element, the first and second circuit elements are connected in parallel, and an equivalent impedance of the combined first and second circuit elements becomes infinite at a predetermined frequency.

* * * * *